United States Patent [19]

Coppola et al.

[11] 4,224,506
[45] Sep. 23, 1980

[54] ELECTRONIC COUNTER WITH NON-VOLATILE MEMORY

[75] Inventors: Vincent G. Coppola, Branford; Edwin G. Grisgraber, Huntington; John L. Lorenzo, Southbury, all of Conn.

[73] Assignee: Pitney Bowes Inc., Stamford, Conn.

[21] Appl. No.: 889,627

[22] Filed: Mar. 24, 1978

[51] Int. Cl.³ ............................................. G06M 3/12
[52] U.S. Cl. ........................... 235/92 FP; 235/92 CA; 235/92 DP; 235/92 ST
[58] Field of Search ........ 235/92 FP, 92 EA, 92 MS, 235/92 CA, 92 ST, 92 PE; 307/238; 365/228

[56] References Cited

U.S. PATENT DOCUMENTS

| | | | |
|---|---|---|---|
| 3,988,575 | 10/1976 | Guimier et al. | 235/92 FP |
| 4,005,409 | 1/1977 | Feuer | 235/92 FP |
| 4,049,951 | 9/1977 | Baty et al. | 235/92 FP |
| 4,089,058 | 5/1978 | Murdock | 235/92 FP |

*Primary Examiner*—Joseph M. Thesz
*Attorney, Agent, or Firm*—Mark Levy; William D. Soltow, Jr.; Albert W. Scribner

[57] ABSTRACT

There is disclosed a volatile electronic counter wherein the count is retained over power off periods. This is accomplished by the use of a non-volatile memory with means for rapidly writing therein the contents of the volatile memory upon sensing a power down condition. Upon later sensing a power up condition, the contents of the non-volatile memory are returned to the volatile memory.

22 Claims, 12 Drawing Figures

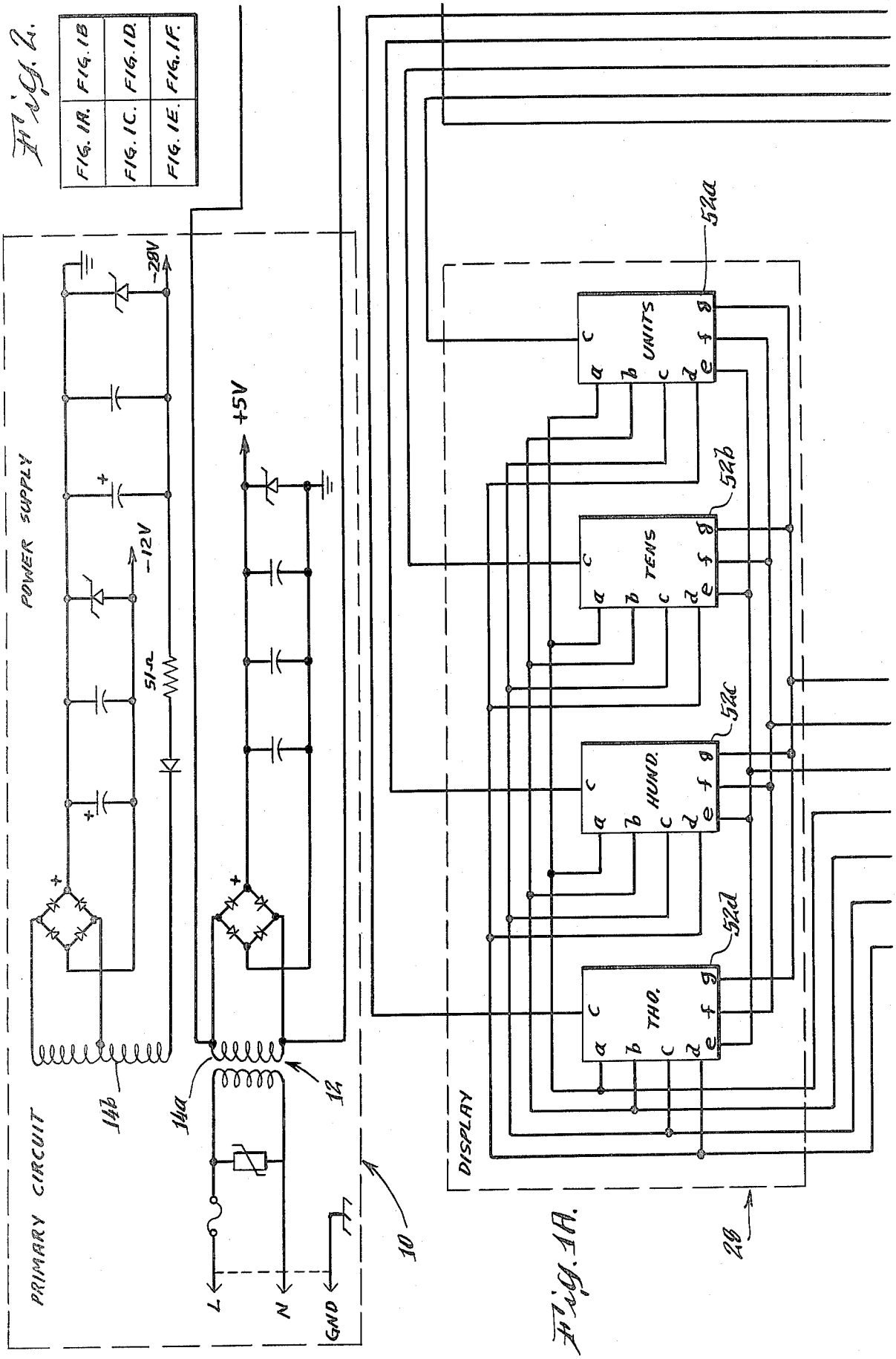

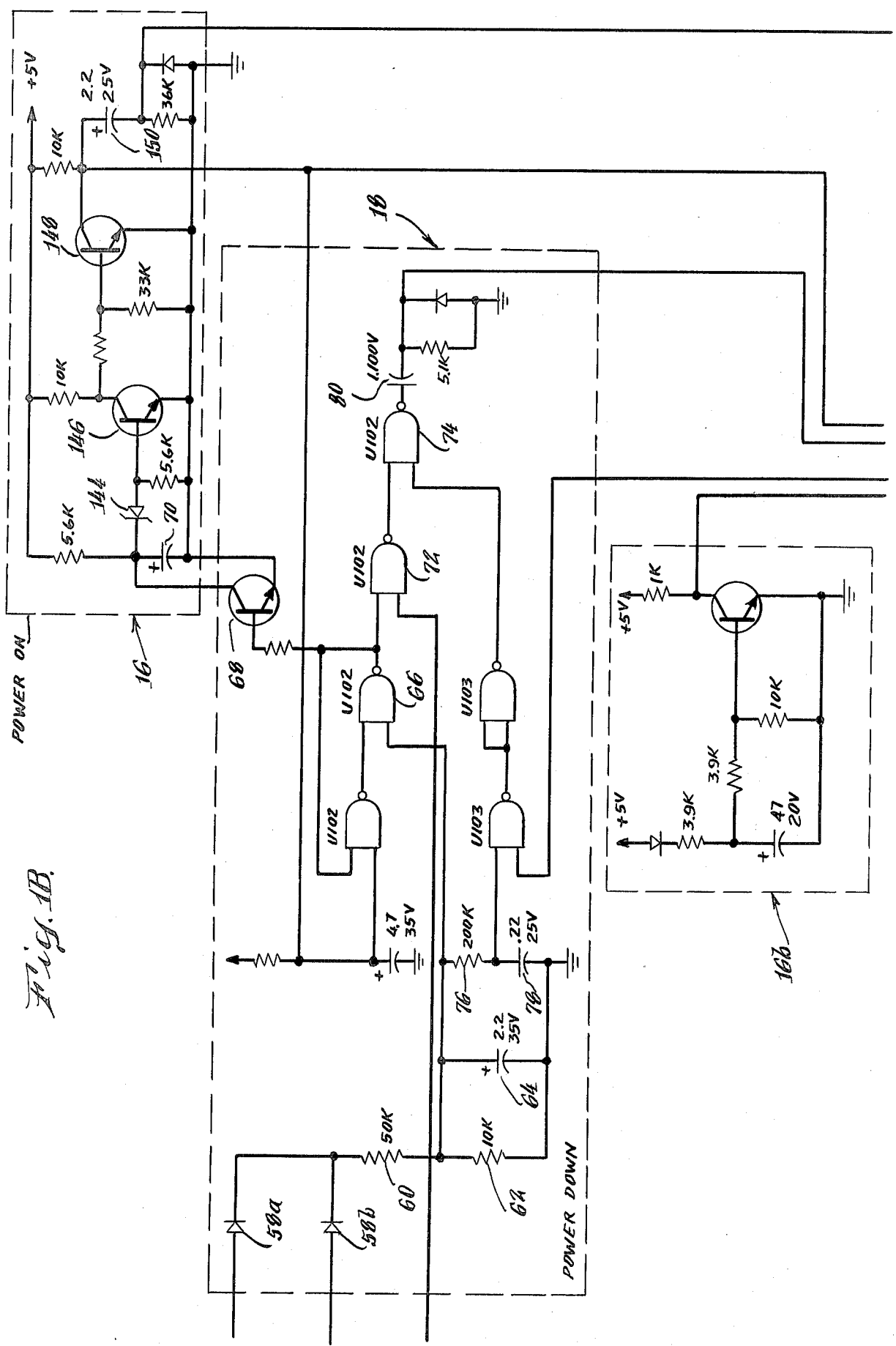

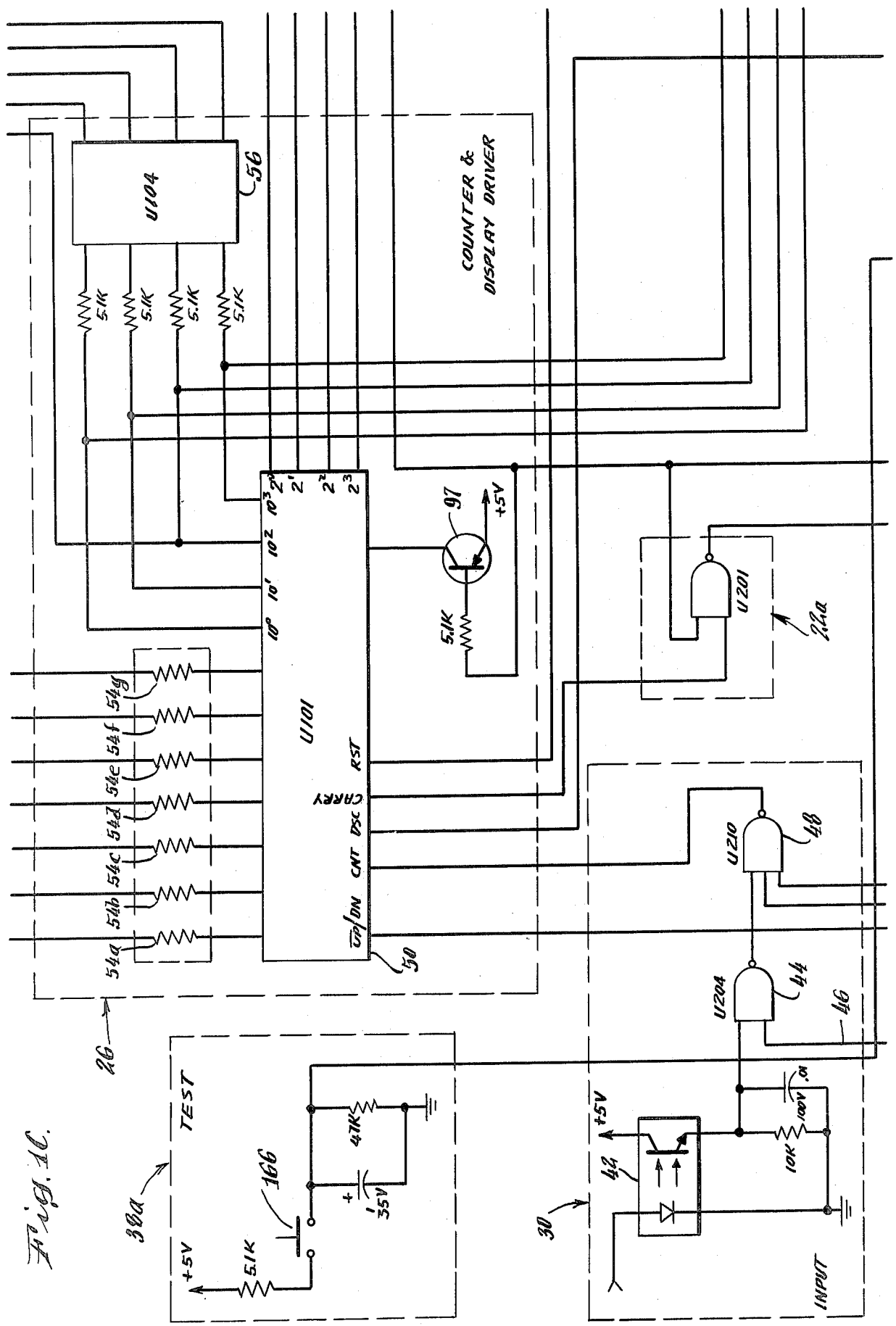

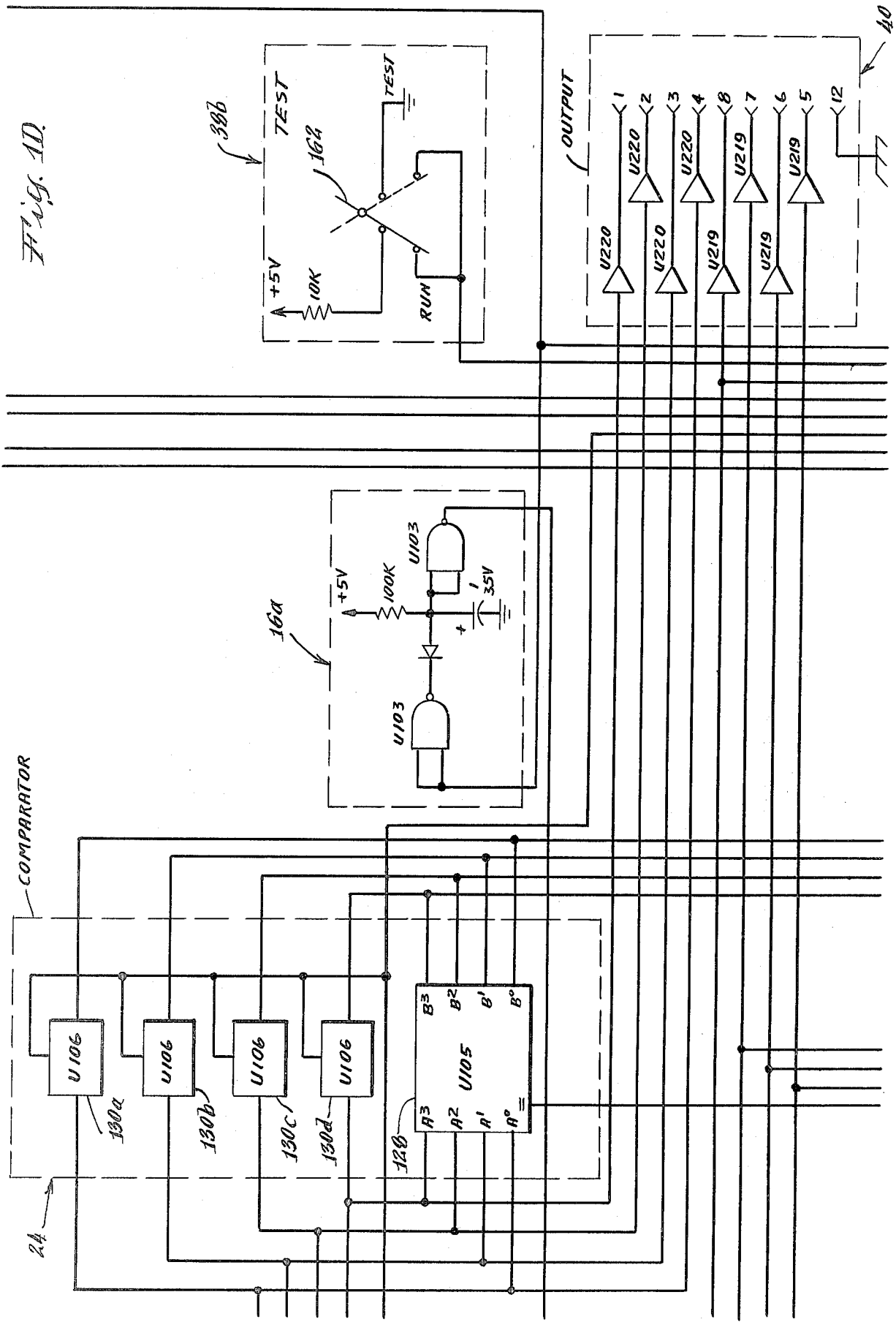

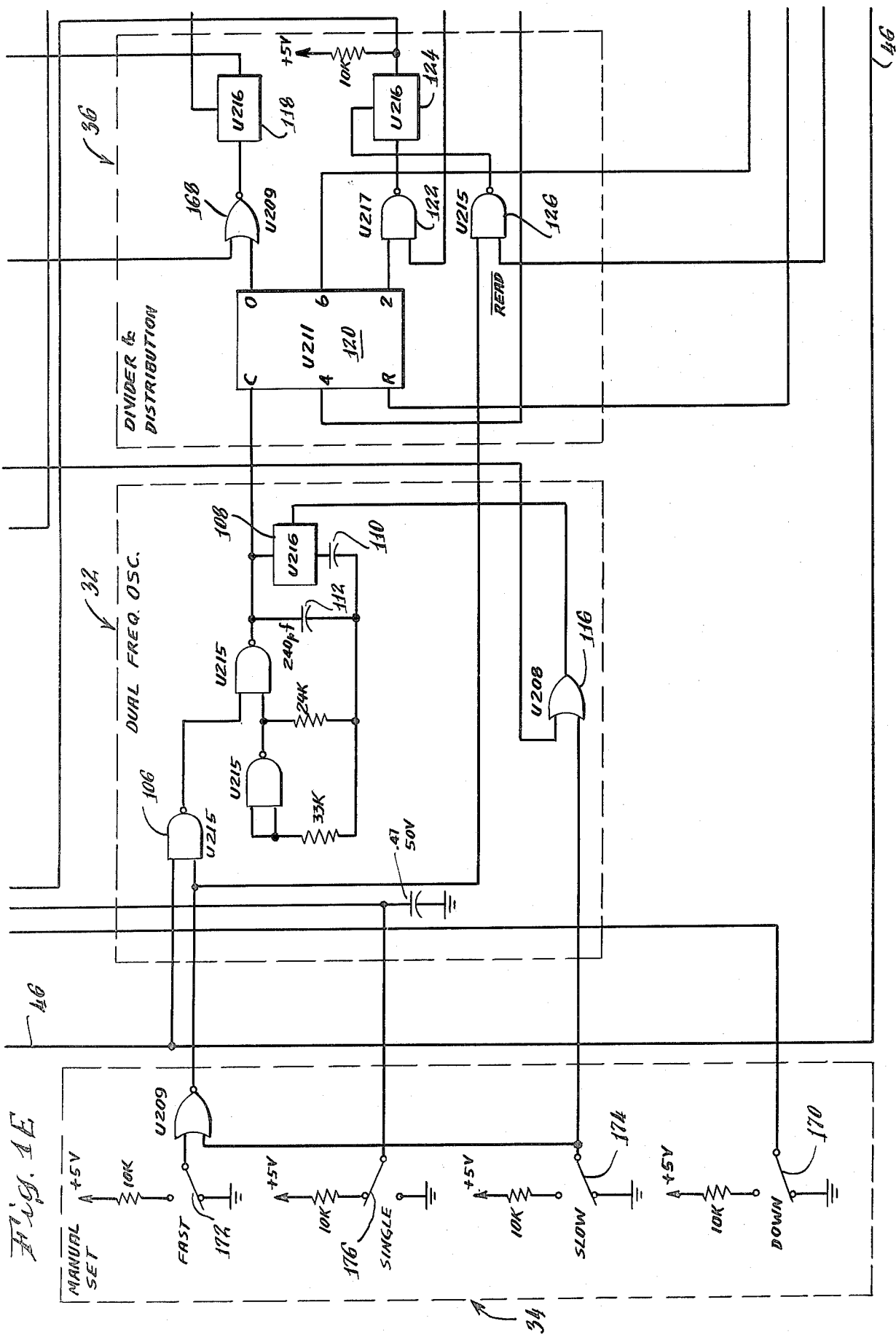

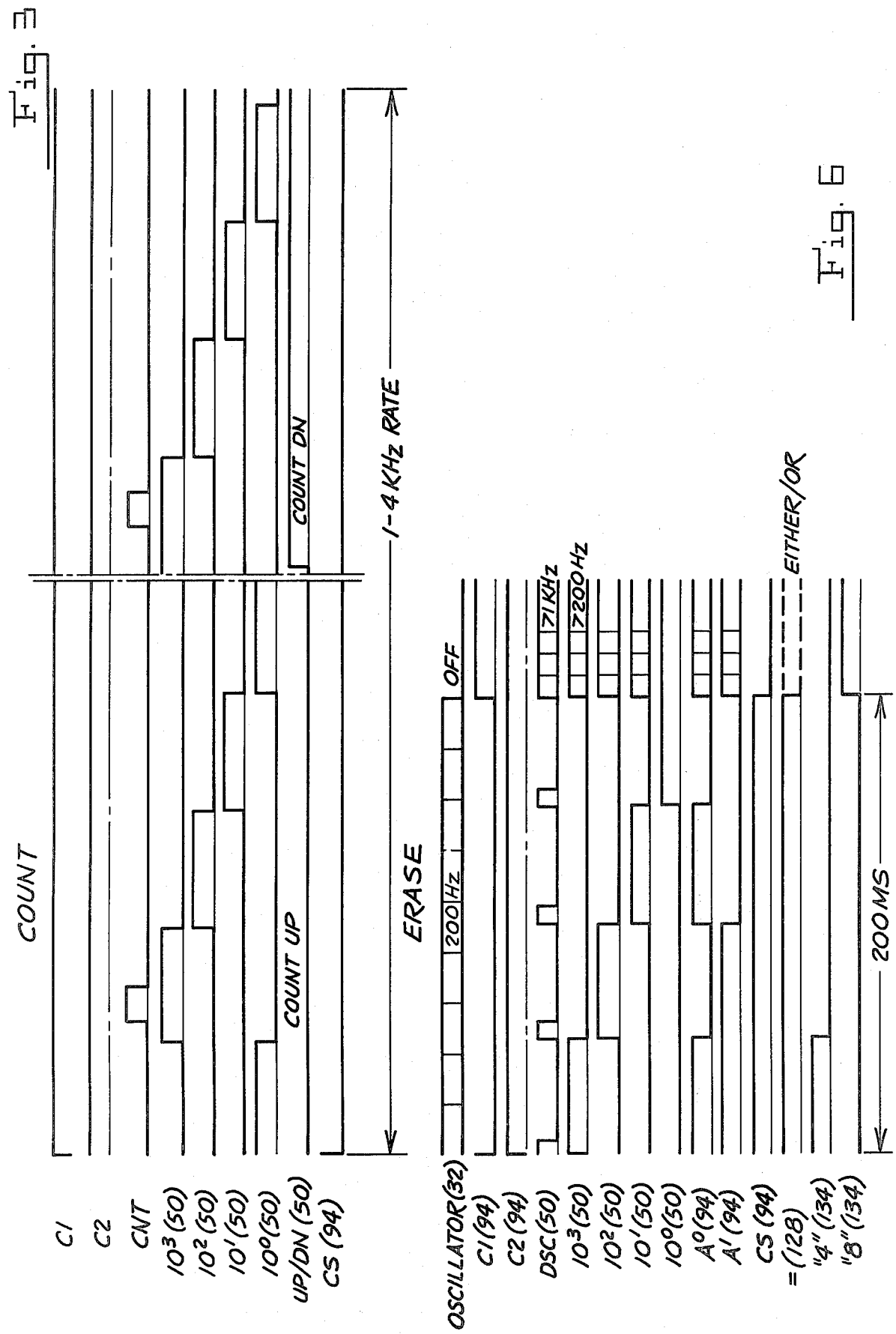

ELECTRONIC COUNTER WITH NON-VOLATILE MEMORY

BACKGROUND OF THE INVENTION

Many industrial systems require counters at various stages therein for retaining a count of operations performed. These counters are often mechanical or electromechanical in nature and have the disadvantages of being unreliable, costly, and bulky. However, they have the advantage of retaining a count during periods of electrical shutdown or power outages. Electronic counters with optical readouts would often be preferable for the reasons that they are highly reliable, relatively inexpensive, and much smaller in size. Such counters include a memory and a visual readout display. The memories are "volatile" which means that they function only so long as power is on and data is lost when power is off. This makes them undesirable for any use in which a count must be maintained over such power out periods.

It is a primary object of the present invention to provide a system which combines the advantages of both types of counter but avoids their disadvantages. The manner in which this and other objects are achieved will be more apparent from the following description and appended claims.

SUMMARY OF THE INVENTION

Apparatus for retaining the count of a volatile memory during periods of power loss. A non-volatile memory is provided. There is included means which is responsive to the onset of a power loss for thereupon transferring the count from the volatile to the non-volatile memory. Means are also provided which are responsive to power resumption for thereupon retransferring the count from the non-volatile to the volatile memory.

BRIEF DESCRIPTION OF THE DRAWINGS

FIGS. 1A-1F combine to form a schematic diagram of a counter in accordance with the present invention;

FIG. 2 illustrates the relationship of the various sheets of drawings (1A-1F inclusive) comprising FIG. 1;

FIGS. 3-6 are timing diagrams illustrating the operation of the counter of the invention.

DESCRIPTION OF THE PREFERRED EMBODIMENT

With power on, the circuit of this invention operates as a conventional electronic counter with strobed BCD output. However when power is disconnected or lost, a special detection and control circuit causes the data contained in the counter to be transferred to the memory and thereafter retained. When power is restored, the data is automatically transferred back to the counter.

The circuit requires only 95-130 VAC 60 Hz at about 0.1 amp for operation. Input count is a 15-20 MA current pulse which is optically coupled to the counter circuitry. There are eight output lines driven by CMOS 4050 buffer drivers. Four lines contain BCD data and the other four are digit strobe lines which indicate which digits data is on the BCD lines.

Figure 1F:
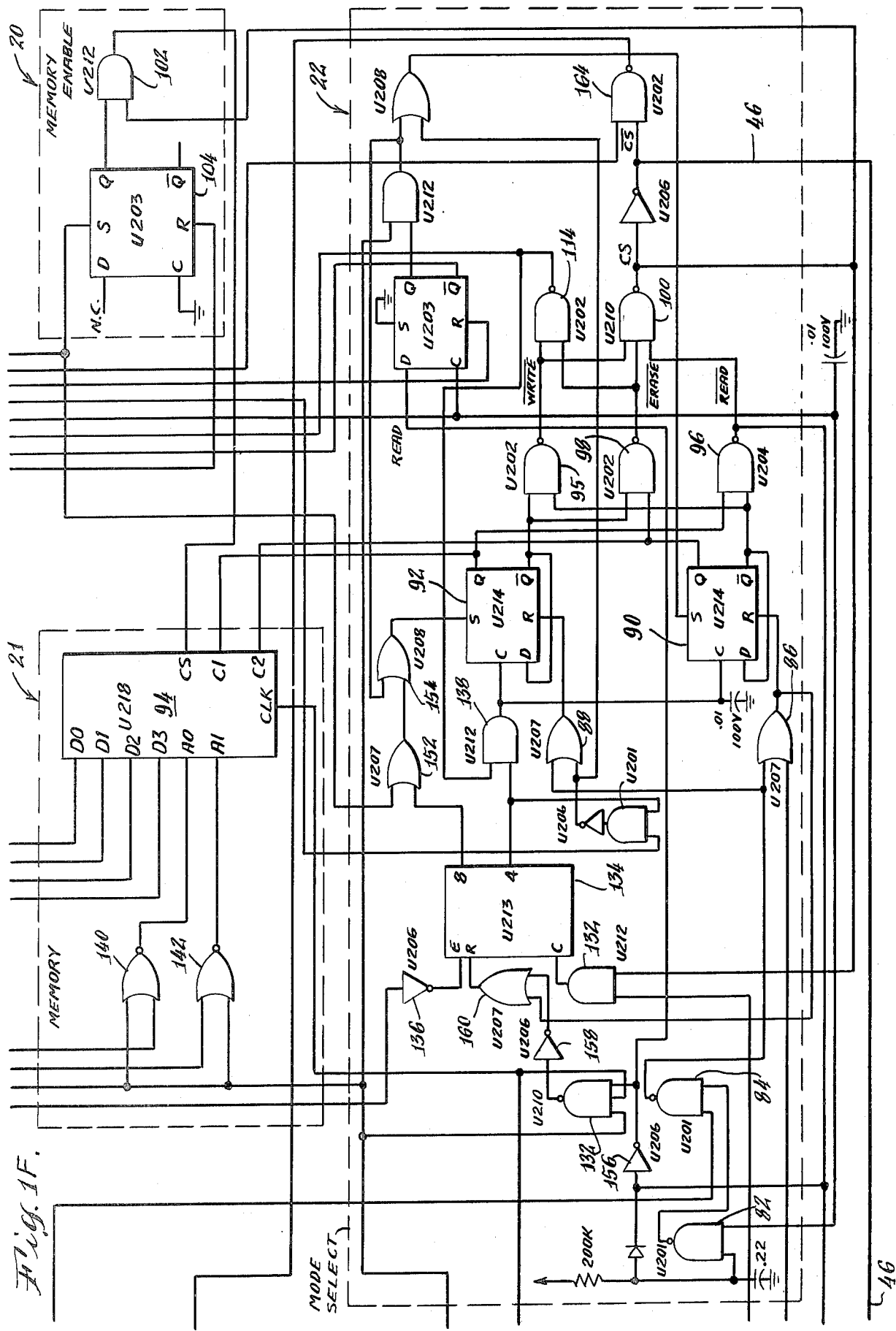
Figure 4:
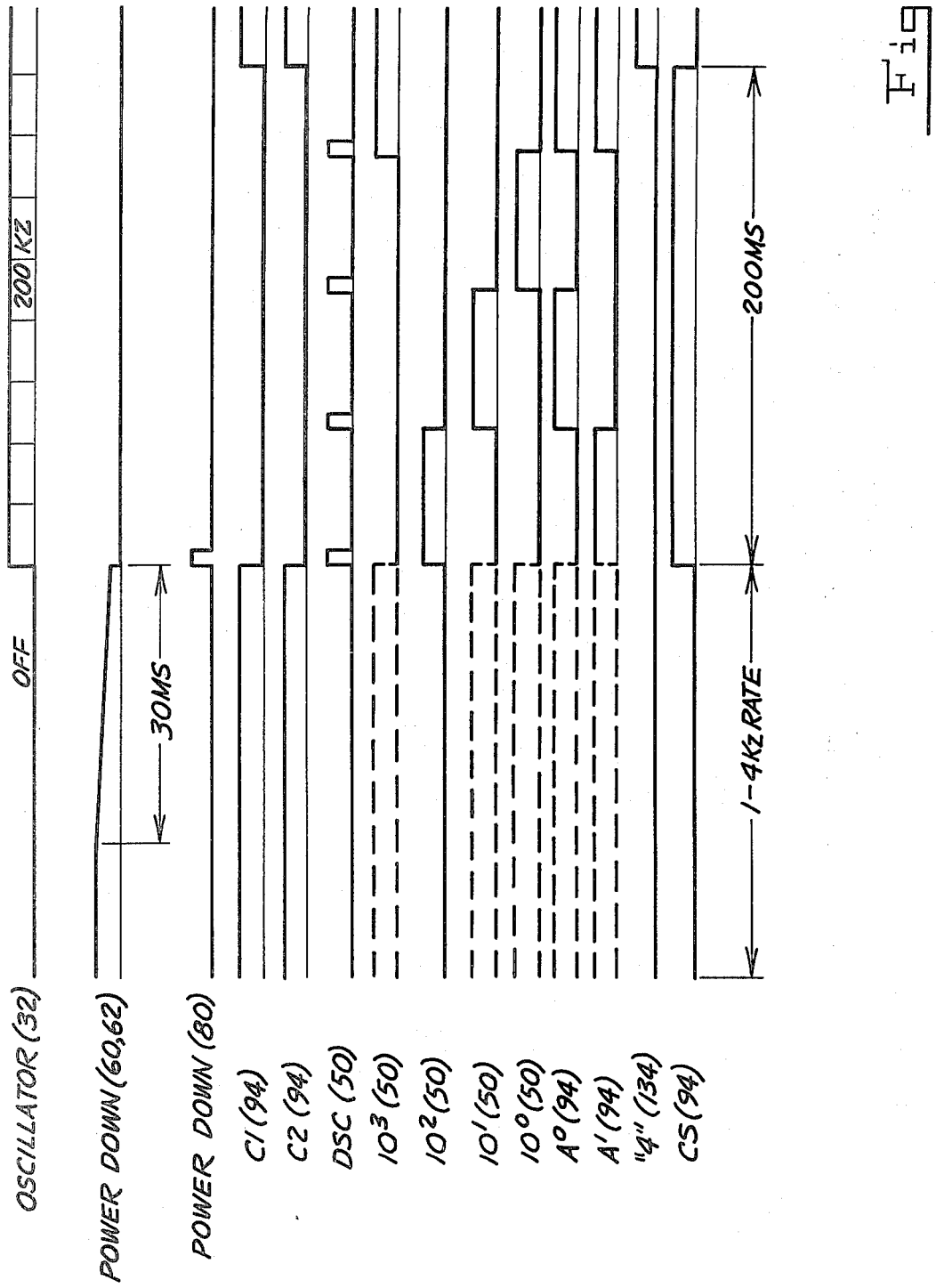
Figure 5:
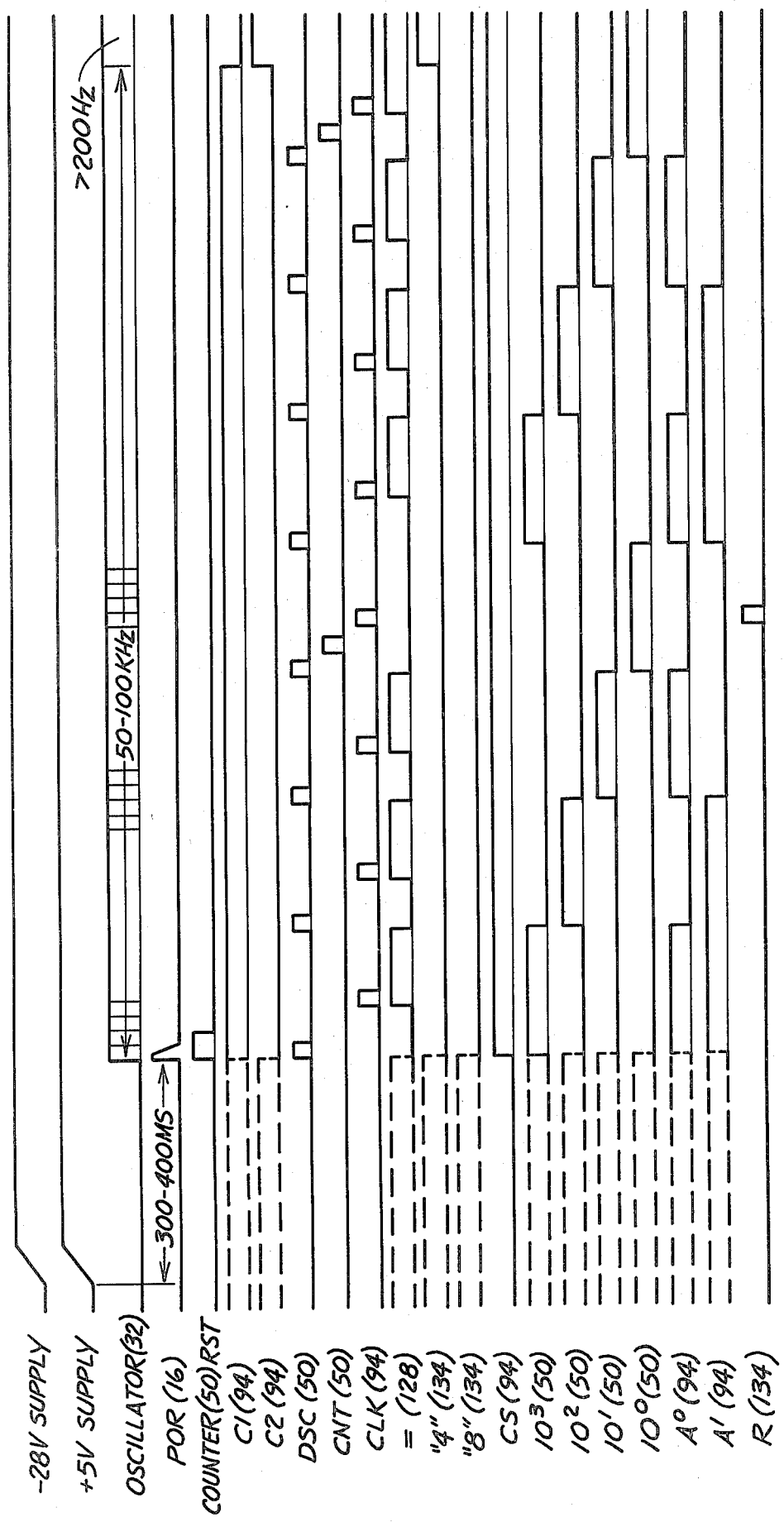
Figure 7:
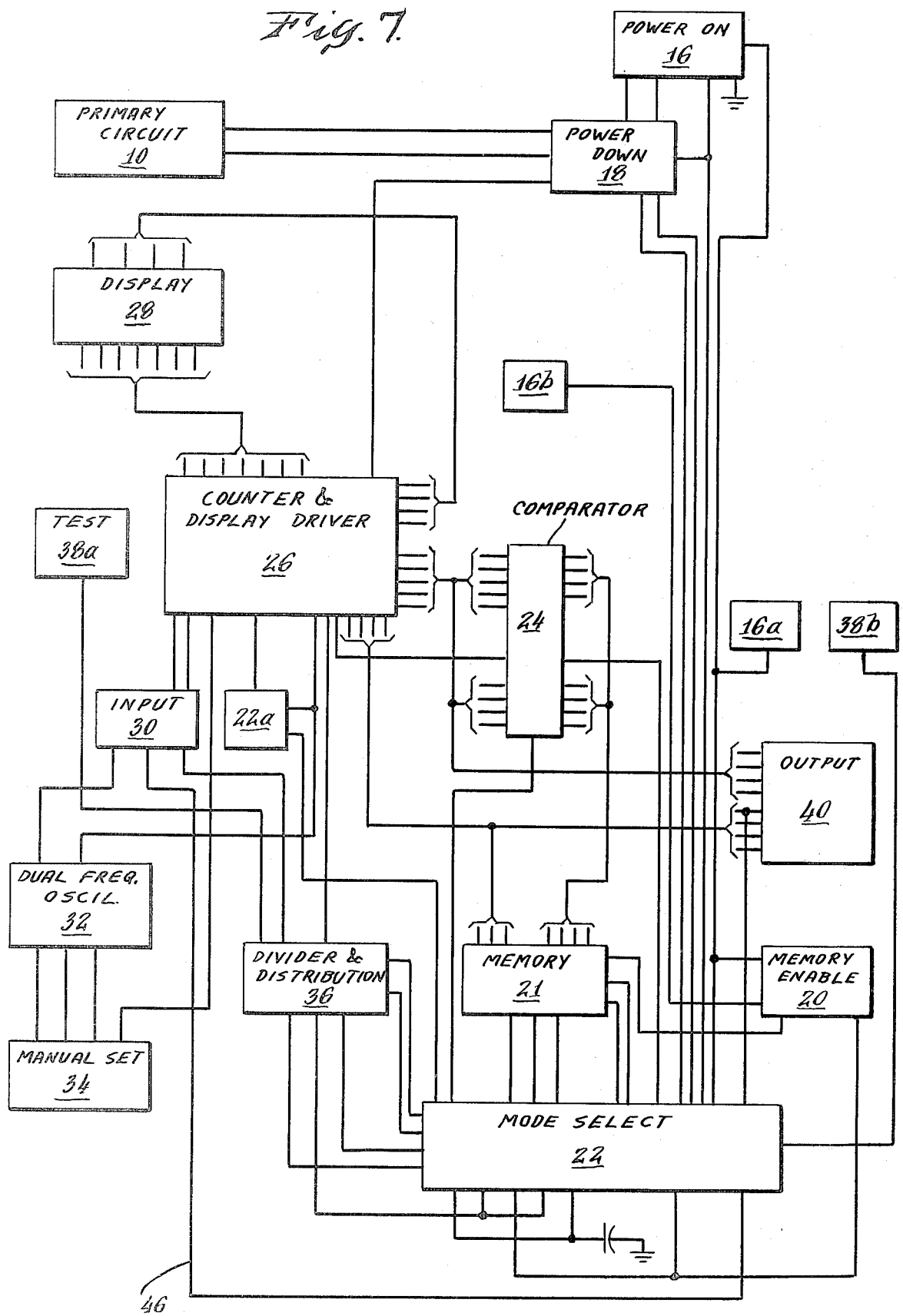
FIG. 7 is a block diagram corresponding to FIGS. 1A-1F, in simplified form, deleting the internal circuits of the blocks.

With particular reference to FIG. 1, there is illustrated a circuit in accordance with this invention. The major elements of the circuit comprise a power supply 10 which is supplied by a transformer 12 having secondary windings 14$a$, 14$b$ to supply +5, −12, and −28 volts to the remainder of the circuit. Other elements of the circuit include: power on circuit 16, 16$a$, 16$b$; power down circuit 18; memory enabling circuit 20; memory circuit 21; mode selector 22, 22$a$; comparator 24; counter and display driver 26; display 28; input circuit 30; dual frequency oscillator 32; manual set control 34; divider and distributor 36; test circuits 38$a$, 38$b$; and output 40. It is believed that the circuit can be best understood by reference to the drawings coupled with an explanation of its actual functioning. For a complete understanding of the invention, the various circuit elements have been assigned reference designations and are described in the following table:

| Reference Designation | Description |
| --- | --- |
| U101 | 4 Digit Ctr/Display Driver (General Instrument AY 4007A) |
| U102 | CMOS Quad 2-in NAND schmitt Triggers |
| U203, U214 | CMOS Dual-D Fl-Fl |
| U104 | Hi Volt/Current Darlington Drivers |
| U105 | CMOS 4-Bit Mag Comparator |
| U106, U216 | CMOS Quad Bilateral SW |
| U103, U201, U202, U204, U215, U217 | CMOS Quad 2-in NAND Gate |
| U206 | CMOS Hex Inverter |
| U208, U207 | CMOS Quad 2-in OR Gate |
| U209 | CMOS Quad 2-in NOR Gate |
| U210 | CMOS Triple 3-in NAND Gate |
| U211, U213 | CMOS Decade Ctr/Driver |
| U212 | CMOS Quad 2-in AND Gate |
| U218 | MNOS 512 Bit Alternate Read Only Memory |
| U219, U220 | CMOS Hex Buffer |

The operation of the circuit of the invention in its various modes will now be described.

COUNT MODE

In this mode, the counter functions in the usual manner to keep and display a count.

The non-volatile memory counter is incremented by a 20 milliamp current pulse to input circuit 30. An optical coupler 42 transmits this pulse to gate 44 and, if enabled by signal $\overline{CS}$ over line 46, this gate passes the count pulse to gate 48. The enabling signal $\overline{CS}$ will be present provided no mode other than "count" is present. Gate 48 acts as an "OR" gate so that a "0" on any one of its three normally high inputs will cause a count to pass to the counter 50. Counter and display driver 26, which includes counter 50, provides all the necessary logic and drive to present four decades of digital data to the display 28 which includes four seven segment numerical elements 52$a$-$d$. The outputs of counter 50, supplied through resistors 54$a$-$g$, provide segment drive to the display 28, while the outputs of counter 50 which connect to the Darlington drivers 56 provide digit drive.

In the COUNT mode an internal oscillator in counter 50 causes data to be strobed to the display at a rate of from 1 KHz to 4 KHz. This strobing sequences from the most significant to the least significant digit. That is, strobe line $10^3$ goes to a "1" ($10^2$, $10^1$, and $10^0$ at "0") which turns on its associated Darlington driver which, in turn, enables numerical element 52d. The data on the seven segment lines from counter 50 are now displayed by element 52d for a time of about 500 microseconds. During this time the other three digits are "OFF". Next, strobe line $10^2$ goes to a "1" ($10^3$, $10^1$, $10^0$ at "0"), the seven segment data has changed to reflect the value of the hundreds count in counter 50, numerical element 52c is enabled, and the other three digits are off. This sequence of strobing continues with $10^1$, then $10^0$ and back to $10^3$ etc. at the 1–4 KHz rate as long as the COUNT mode is in operation.

In addition to seven segment data being strobed to the display, BCD data ($2^0$, $2^1$, $2^2$, $2^3$) is also strobed to the output 40, which may be connected to an external device such as a printer or data collection device.

WRITE MODE

In this mode, a loss of power causes a displayed count to be rapidly "written" into a non-volatile memory.

This mode is initiated by a loss of AC line power for a period in excess of about 30 milliseconds. Hence, either a momentary power loss or complete loss will trigger the control circuitry. Power down circuit 18, detects a power loss directly at the secondary 14a of the transformer 12 via diodes 58a and 58b, divider resistors 60 and 62, and capacitor 64. The capacitor charge is maintained at a level above a "0" such that when current ceases to flow into it from the secondary of transformer 12 through diodes 58a, 58b and resistor 60, capacitor 64 discharges through resistor 62. As a result of the RC time constant, a "0" is applied to gate 66 after about 30 milliseconds of power loss. The output of gate 66 goes to a "1" which turns on transistor 68, very quickly discharging capacitor 70 and thereby conditioning the "power on" circuit 16 in the event that power loss is momentary.

The "1" from gate 66 is also applied to gate 72 enabling that gate so that at the next $10^2$ digit strobe signal it receives, its output to gate 74 will go to a "0". Since the other pin of gate 74 is at a "1" (controlled by the time constant of a resistor 76—capacitor 78 combination) this will cause the output of gate 74 to go from a "0" to a "1". This transition is differentiated by capacitor 80 and a "1" pulse is generated, which is coupled through gates 82, 84, 86, 88 to reset pins of flip flops 90, 92 in the mode select circuit 22. This causes the two "Q" outputs of the flip flops to go to "0". These are connected to the C1, C2 inputs of a memory chip 94. "0's" on both these inputs condition the memory for a "write data" operation. In addition, the $\overline{Q}$ outputs of flip flops 90, 92, through gates 95 and 114 and transistor 97, disable the display 28 to conserve power.

CS is the "chip select" input of the memory 94 and it must be high to enable the device for any data transfer. CS is high at this time since it is derived from flip flops 90, and 92 via gates 95, 96, 98, 100, and 102 (in Memory Enable Circuit 20). One pin of gate 102 receives a "1" from output "Q" of a flip flop 104 set at "power on". This allows the output of gate 102 to go to a "1" when a "1" is received from gate 100.

The normal output from counter 50 has a frequency of approximately 1 KHz. This is much faster than memory 94 can handle. Accordingly, the $\overline{CS}$ output of gate U206 also enables the dual frequency oscillator 32 via line 46 and gate 106 while disabling the input circuit 30 through gate 44. In addition, a switch 108 in oscillator 32 is put into its low impedance state in either the WRITE or ERASE mode as decoded by gate 114 (in Mode Select 22) and switched by gate 116. This causes a capacitor 110 to become part of the active oscillator circuitry in parallel with a capacitor 112, resulting in low frequency (about 200 Hz) oscillations. The $\overline{CS}$ signal also causes a switch 118 in divider 36 to become low impedance which stops the internal oscillator of counter 50 through its "DSC" pin allowing the external oscillator to override the internal one.

A counter 120 in divider and distribution circuit 36 divides the oscillator frequency by 10 and provides separation of control signals. The "0" pin of counter 120 is the "0" count and it is used to clock the digit select clock (DSC) pin of counter 50. After thus selecting the next digit, the "2" pin output of counter 120, (which in the READ mode causes counter 50 to count via gate 122 and gate 48), is inhibited by a switch 124 controlled through a gate 126.

The BCD data present at the output of counter 50 is now switched to the B inputs of a comparator 128 in comparator circuit 24 and to the inputs of memory 94 through switches 130a–d which are "on" in either the WRITE or ERASE modes. Since identical data is then present at the A and B inputs of comparator 128, the comparison is true and the "equal" output goes to a "1". This enables a counter 134.

When the count in counter 120 reaches 4, the "4" output goes to a "1", but this signal is only functional in the READ mode. It is inhibited by gate 132 and memory 94 during WRITE and ERASE.

When the count in counter 120 reaches 6, the "6" output goes to a "1" and is gated via gate 132 to counter 134. Since the "enable" input of counter 134 is connected to the "equal" output of the comparator 128, via inverter 136, the count is allowed to increment counter 134. As counter 120 continues to cycle, each "0" selects a new digit in counter 50 and each "6" advances counter 134. When counter 134 reaches the count of 4, its "4" output goes to a "1" which is gated to the clock inputs of flip flops 90 and 92 through a gate 138. This clocking causes both flip flops 90 and 92 to toggle (since $\overline{Q}$ is connected to D) and each Q goes to a "1".

At this time all four digits of data have been written into the memory 94. The four bits of each digit are located in four memory locations (4 bits per location). The memory locations are selected by decoding the digit strobe outputs $10^3$, $10^2$, $10^1$, $10^0$ of counter 50 through gates 140 and 142. Thus as the four different digits are selected, four unique address codes are presented at A0 and A1 on memory 94. The data out of counter 50 which is switched to the B inputs of comparator 128 is also connected to the data inputs of memory 94 and as the digit strobes sequence through the four digits (approx. 50 milliseconds per digit) each digit change results in a different address for each of the four memory locations. After flip flops 90, 92 toggle, "CS" returns to a "0" putting memory 94 in standby, a "safe" state in which to remain while power is going down.

READ MODE

In this mode, power resumption causes the count stored in the non-volatile memory to be "read" back into the display.

When power is reapplied to the primary of transformer 12, capacitor 70 in the "power on" circuit 16, begins to charge. When the Zener voltage of diode 144 is reached, transistor 146 begins conduction which turns off transistor 148. The "1" which then appears on the collector of transistor 148 is differentiated by capacitor 150, and the resulting "1" pulse is the "power on" pulse. This pulse occurs some 300-400 milliseconds after the primary circuit is energized.

To be sure that no transition states affect memory 94 as voltage is being established, flip flop 104 (in Memory Enable Circuit 20) is held reset by circuit 16b. This insures a "0" CS signal to memory 94 until subsequently, the "power on" pulse changes it to a "1". Power on also causes the "Q" output of flip flop 92 to go to a "1" by a direct set through gates 152 and 154. Similarly, the "Q" output of flip flop 90 goes to a "0" by a direct reset through gate 86. Thus C1 and C2 of memiory 94 are at "1" and "0" respectively, which is the read mode for memory 94.

The oscillator 32 is enabled through gate 106 and, since this is the READ mode, switch 108 is "off" or in its high impedance state which establishes the high frequency oscillation mode of the oscillator. Also, switches 130a-d are "off" so that the A and B inputs to comparator 128 are connected to the counter 50 and the memory 94 respectively. The functioning of the counter 120 in divider circuit 36, the oscillator 32, counter 134, and counter 50 is now similar to that of the WRITE mode, except that comparator 128 has different inputs, the oscillator is faster (50 K-100 K Hz) and the "2" count which was inhibited in WRITE is now gated through gate 122 which also has an input connected to the $10^0$ output of counter 50. Thus, the "2" count increments counter 50 at every $10^0$ strobe time. In this manner, four digit strobes occur for every count up pulse to counter 50. This arrangement allows a digit for digit comparison between the counter 50 and memory 94. Counter 134 is reset each $10^0$ strobe time and is incremented at each equality of A's and B's in comparator 128, at the count of "6" from the counter 120 in divider 36. Since counter 134 is reset at every $10^0$ strobe time, it must "see" four consecutive equalities from comparator 128 before its "4" output goes to a "1". This will only occur when the four digit number present in counter 50 is equal to the four digit number stored in memory 94 from the previous WRITE cycle. When there is such an equality, both of the flip flops 90, 92 are toggled by this "1" through gate 138. This causes the "Q" outputs of flip flops 92 and 90 to change to "0", "1" respectively, which conditions the memory for an ERASE cycle.

ERASE MODE

During the ERASE time counter 134 is inhibited from reset via gate 96, inverter 156, gate 132, inverter 158, and gate 160, hence the count of four is retained (from the preceding READ). The oscillator 32 is set to its low frequency mode as it was for WRITE. Counter 50 is inhibited from counting, and switches 130a-d are turned on so that the "A" inputs are connected to the "B" inputs of comparator 128, as in WRITE. Thus the memory 94 will now be cycled through its four addresses (by the decoding of strobe lines with gates 140, 142). Because of the "on" condition of switches 130, each of the four strobe times will result in an equality in comparator 128 and counter 134 will continue to count up from four through the same gating as in WRITE. After the fourth strobe time counter 134 will reach the count of eight which puts a "1" on gate 152 and on the "S" input of flip flop 92, changing its "Q" output (C1) to a "1". Since the "Q" output of flip flop 90 (C2) was already at a "1" the system is now returned to the COUNT mode, ready to function as a normal counter.

TEST MODE

The purpose of this mode is to enable a service person to check the system in a static mode; it has no affect on any of the operating modes.

When switch 162 in test circuit 38b is changed from "RUN" to "TEST", switch 118 in divider circuit 36 is turned on through gate 164. This stops the internal oscillator of counter 50 and, since the external oscillator is off (assuming the COUNT mode), the display strobing ceases at whatever digit was on when the switch was changed. Thus a single digit is displayed and static BCD and strobe data appears at the output 40. To change the static data, the digit select switch 166 in test circuit 38a is actuated. This causes the next digit to be displayed and new BCD data appears on the output. This manual digit select is accomplished through gate 168 and switch 118, to the digit select clock (DSC) input of counter 50.

MANUAL SET MODE

The display 28 may be set manually to a particular number by means of four push button switches in the manual set circuit 34. The direction of count is normally up. However, actuation of DOWN switch 170 will cause the count direction to be reversed. This is useful during initial setting. A FAST switch 172 will cause counter 50 to operate at a high rate by overriding its internal oscillator. A SLOW switch 174 causes counter 50 to count at a slow rate and will normally be utilized after the fast switch or if the count is to be changed by relatively few numbers. A SINGLE switch 176 will advance or decrement counter 50, one count by each actuation.

TIMING

As a further aid in understanding the operation of this invention, reference is made to the timing charts of FIGS. 3-6. These illustrate, respectively, the wave forms and timing of the COUNT, WRITE, READ, and ERASE modes. As these charts merely illustrate functions already described in detail, it is believed that they will be self explanatory to those skilled in the art.

It is believed that it will be obvious to those skilled in the art that all the objectives of this invention have been achieved by the circuitry described above. It will also be apparent that a number of variations and modifications may be made therein without departing from the spirit and scope of the invention. Accordingly, the foregoing is to be construed as illustrative only, rather than limiting. This invention is limited only by the scope of the following claims.

What is claimed is:

1. Apparatus for retaining the count of a volatile memory counter during periods of power loss which comprises:
   a non-volatile semiconductor memory;
   data transferring means;
   means for controlling said memory and memory counter including means responsive to the onset of a power loss for thereupon effecting the transfer of the count from said volatile memory counter to said non-volatile semiconductor memory; and
   said controlling means including means responsive to power resumption for thereupon effecting the transfer of the count from said non-volatile memory to said volatile memory counter via said transferring means;

said controlling means comprising
means for comparing the value of each digit stored in said volatile memory counter with each digit stored in said non-volatile memory;
means for stepping the value of each digit stored in said volatile memory counter; and
means responsive to said comparing means for stabilizing the value of each digit stored in said volatile memory counter at the value of a digit in said non-volatile memory.

2. The apparatus of claim 1 wherein the count comprises a plurality of digits, said power loss responsive means comprises:
auxiliary oscillator means external of said volatile memory counter; and
said controlling means comprises means for controlling the transfer of the value of each digit stored in said counter to a discrete address in said non-volatile memory.

3. The apparatus of claim 2 wherein said transferring means comprises:
means driven by said auxiliary oscillator means for sequentially transferring the value of each stored digit from said volatile memory counter to a different address in said non-volatile memory.

4. The apparatus of claim 3 wherein said transferring means comprises:
means for enabling said non-volatile memory upon the onset of a power loss; and
means for disabling said non-volatile memory upon completion of a transfer sequence.

5. The apparatus of claim 4 wherein said transferring means comprises:
means for gating selected pulses from said oscillator; and
means for employing said selected pulses to sequentially select the digits to be transferred.

6. The apparatus of claim 1 wherein said value stepping means comprises auxiliary oscillator means external of said volatile memory counter.

7. The apparatus of claim 6 wherein said auxiliary oscillator means comprises:
a pulse producing oscillator;
means for gating selected pulses from said oscillator; and
means for driving said volatile memory counter with said selected pulses.

8. The method of retaining the count in a volatile memory counter during periods of power loss which comprises:
providing a non-volatile memory;
sensing a loss of power;
transferring the count stored in said volatile memory counter to said non-volatile memory upon sensing such loss;
sensing a resumption of power; and
resetting said volatile memory counter to equal the count in said non-volatile memory upon sensing such resumption by stepping said volatile memory counter, comparing the count therein with the corresponding values stored in said non-volatile memory, and stopping said stepping when the values are equal.

9. The method of claim 8 wherein the count comprises a plurality of decimal digits, including the step of transferring the respective values of the decimal digits stored in said volatile memory counter sequentially to said non-volatile memory.

10. A memory system comprising a first electronic counter connected to receive input data to provide address and data signals, a memory connected to receive said address signals and having data terminals, condition responsive means for selectively producing read and write signals for controlling said memory to apply data stored therein to said data terminals and store data therein applied to said data terminals, comparator means coupled to compare said data signals with data on said memory data terminals for producing equality signals, and a second counter responsive to said equality signals for stepping said address signals.

11. The memory system of claim 10 further comprising a multi-digit display connected to said first electronic counter, whereby different address signals energize different digits of said display and said data signals determine the number displayed at each digit.

12. The system of claim 10 wherein said condition responsive means comprise means for producing said read and write signals in response to application of power to and removal of operating power from said first counter.

13. The system of claim 10 wherein said condition responsive means comprises a pair of flip flops, means for controlling the states of said flip flops in response to determined conditions, and gate means coupled to the output of said flip flops for selectively producing said read and write signals.

14. The system of claim 13 wherein said second counter has an output coupled to reset said flip flops at a determined count.

15. The memory system of claim 13 further comprising means for controlling said first electronic counter to reset said flip flops at a first determined count in response to a read signal, to reset said flip flops at a second count double said first count in response to a write signal, and to change the state of said flip flops at said first count in response to a write signal for producing an erase signal, whereby data may be erased from said memory following the return of data to said first counter.

16. The memory system of claim 10 wherein said first counter has an internal clock for stepping said address signals, and further comprising two frequency clock means coupled to said counter for stepping said first counter at a rate lower than said internal clock in response to write signals and for stepping said first counter at a rate higher than said internal clock in response to a read signal.

17. The system of claim 10 further comprising switch means responsive to said write signals for directly applying said data signals to said memory data terminals, said comparator means having two sets of input terminals, whereby the same signals are applied to the two sets of input terminals of said comparator in response to write signals.

18. A memory system comprising a first electronic counter connected to receive input data for producing address and data signals, a memory coupled to receive said address signals and having data terminals, condition responsive means for selectively producing read and write signals for controlling said memory to apply stored data to said data terminals and to store data therein applied to said data terminals, a variable rate clock means connected to be enabled in response to said read and write signals for enabling said first counter to store counts read out of said memory at a first rate and to be enabled in response to said write signals for applying data signals to said data terminals at a second rate substantially slower than said first rate.

19. The memory system of claim 18 further including a multi-digit display coupled to receive address and data signals from said first counter, said first counter having an internal clock for stepping said address signals at a third rate different than said first and second rates for effecting display of data on said display means.

20. The memory system of claim 18 further comprising a second counter, means stepping said second counter at rates determined by said clock means, and means responsive to determined counts of said second counter for resetting said condition responsive means.

21. The memory system of claim 20 further comprising means responsive to equality of the count of said first electronic counter and data stored in determined addresses of said memory for stepping said second counter in to response to said write signals.

22. The memory system of claim 18 wherein said first counter is a volatile counter and said memory is a non-volatile memory, said condition responsive means being coupled to be responsive to operating voltages applied to said system.

* * * * *